US010541043B1

(12) United States Patent
Wisnesky, II et al.

(10) Patent No.: US 10,541,043 B1
(45) Date of Patent: Jan. 21, 2020

(54) ON DEMAND DATA STREAM CONTROLLER FOR PROGRAMMING AND EXECUTING OPERATIONS IN AN INTEGRATED CIRCUIT

(71) Applicant: Cadence Design Systems, Inc., San Jose, CA (US)

(72) Inventors: Carl Alexander Wisnesky, II, Apalachin, NY (US); Patrick Wayne Gallagher, Apalachin, NY (US); Steven Lee Gregor, Owego, NY (US); Norman Robert Card, Vestal, NY (US)

(73) Assignee: CADENCE DESIGN SYSTEMS, INC., San Jose, CA (US)

(*) Notice: Subject to any disclaimer, the term of this patent is extended or adjusted under 35 U.S.C. 154(b) by 16 days.

(21) Appl. No.: 15/421,158

(22) Filed: Jan. 31, 2017

(51) Int. Cl.
*G11C 29/44* (2006.01)
*G11C 29/12* (2006.01)
*G06F 11/25* (2006.01)

(52) U.S. Cl.
CPC .............. *G11C 29/44* (2013.01); *G06F 11/25* (2013.01); *G11C 29/12015* (2013.01)

(58) Field of Classification Search
CPC .... G11C 29/44; G11C 29/12015; G06F 11/25
See application file for complete search history.

(56) References Cited

U.S. PATENT DOCUMENTS

| 6,651,201 | B1* | 11/2003 | Adams | G01R 31/2891 |
| | | | | 714/733 |
| 6,681,359 | B1* | 1/2004 | Au | G01R 31/318533 |
| | | | | 714/727 |
| 6,728,914 | B2 | 4/2004 | McCauley et al. | |
| 7,168,005 | B2* | 1/2007 | Adams | G06F 11/2242 |
| | | | | 714/31 |
| 7,203,873 | B1* | 4/2007 | Adams | G11C 29/1201 |
| | | | | 714/31 |
| 8,677,196 | B1 | 3/2014 | Gregor et al. | |
| 8,990,749 | B2 | 3/2015 | Arora et al. | |
| 9,170,301 | B1 | 10/2015 | Gallagher et al. | |
| 9,448,282 | B1 | 9/2016 | Meehl | |
| 2017/0228388 | A1* | 8/2017 | Venkat | G06F 3/0604 |

* cited by examiner

*Primary Examiner* — Cynthia Britt
*Assistant Examiner* — Rong Tang
(74) *Attorney, Agent, or Firm* — Foley & Lardner LLP

(57) ABSTRACT

Embodiments relate generally to a scalable, modularized mechanism which allows for storing programmable data streams on chip and provides repeatable on-demand issuances of data streams to one or more targeted instruments. In some embodiments, multiple data streams are grouped into data stream schedules to perform a series of programmable operations on demand. In these and other embodiments, data stream schedules can be reused and further grouped into data stream plans that can be executed in any order upon request or are hard-coded in a specific order.

19 Claims, 13 Drawing Sheets

US 10,541,043 B1

ON DEMAND DATA STREAM CONTROLLER FOR PROGRAMMING AND EXECUTING OPERATIONS IN AN INTEGRATED CIRCUIT

TECHNICAL FIELD

The present embodiments relate generally to implementing desired modes of operation into an integrated circuit and more particularly to an on-demand data stream controller for programming and executing desired operations in an integrated circuit.

BACKGROUND

During the design of an integrated circuit (IC) (e.g. application specific integrated circuit (ASIC) or system-on-chip (SOC)), design for test (DFT) and automatic test pattern generation (ATPG) methodologies are typically used to develop tests that, when applied to the IC, can detect potential failures of the IC as a whole. DFT and other design methodologies can also include building mission mode capabilities into an existing IC design. As used herein, mission mode refers to operations that occur when the IC is in its functional environment, as opposed to tests that are performed during manufacturing or when a device is first being powered up. This could be a run time application of test, for example. During mission mode and/or in safety critical applications, functional logic is taken offline and tested to detect issues during functional operation. Mission mode tests are typically limited to those capable of being performed in a very small window of time so as not to interfere with functional operation. This very small window of time cannot be met when data streams are loaded from off-chip sources. Also, mission mode tests must have a very fine granularity. This means that mission mode tests must be individually run on very small portions of the design to avoid impacting functional operations. This is a much finer granularity of testing than manufacturing tests during which the entire chip or large portions of the chip are tested at once.

Conventional techniques for embedding mission mode and other test capabilities into an IC significantly increase the area, power, and complexity of the entire system. For analog and digital parts common in many applications such as in the automotive industry, this significant logic increase or packaging change for a design can make these techniques unusable or push the design out of a profitable price point in its market.

SUMMARY

The present embodiments relate generally to a scalable, modularized mechanism which allows for storing programmable data streams on chip and provides repeatable on-demand issuances of data streams to one or more targeted instruments. In some embodiments, multiple data streams are grouped into data stream schedules to perform a series of programmable operations on demand. In these and other embodiments, data stream schedules can be reused and further grouped into data stream plans that can be executed in any order upon request or are hard-coded in a specific order.

BRIEF DESCRIPTION OF THE DRAWINGS

These and other aspects and features of the present embodiments will become apparent to those ordinarily skilled in the art upon review of the following description of specific embodiments in conjunction with the accompanying figures, wherein.

DETAILED DESCRIPTION OF THE PREFERRED EMBODIMENTS

The present embodiments will now be described in detail with reference to the drawings, which are provided as illustrative examples of the embodiments so as to enable those skilled in the art to practice the embodiments and alternatives apparent to those skilled in the art. Notably, the figures and examples below are not meant to limit the scope of the present embodiments to a single embodiment, but other embodiments are possible by way of interchange of some or all of the described or illustrated elements. Moreover, where certain elements of the present embodiments can be partially or fully implemented using known components, only those portions of such known components that are necessary for an understanding of the present embodiments will be described, and detailed descriptions of other portions of such known components will be omitted so as not to obscure the present embodiments. Embodiments described as being implemented in software should not be limited thereto, but can include embodiments implemented in hardware, or combinations of software and hardware, and vice-versa, as will be apparent to those skilled in the art, unless otherwise specified herein. In the present specification, an embodiment showing a singular component should not be considered limiting; rather, the present disclosure is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present embodiments encompass present and future known equivalents to the known components referred to herein by way of illustration.

According to certain general aspects, the present embodiments relate to a scalable, modularized mechanism which allows for storing programmable data streams on chip and provides repeatable on-demand issuances of data streams to one or more targeted instruments. In some embodiments, multiple data streams are grouped into data stream schedules to perform a series of programmable operations on demand. In these and other embodiments, data stream schedules can be reused and further grouped into data stream plans that can be executed in any order upon request or are hard-coded in a specific order.

Figure 1A:
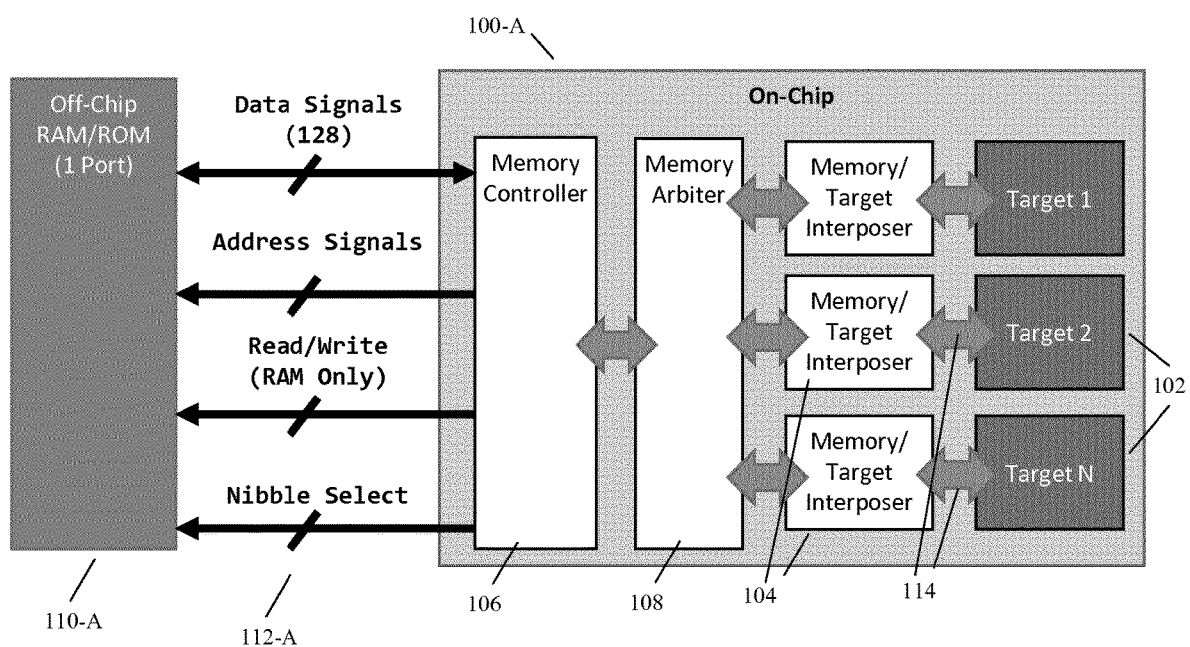
FIGS. 1A and 1B are block diagrams illustrating two different possible approaches for performing operations on targets in integrated circuits.
Figure 1B:
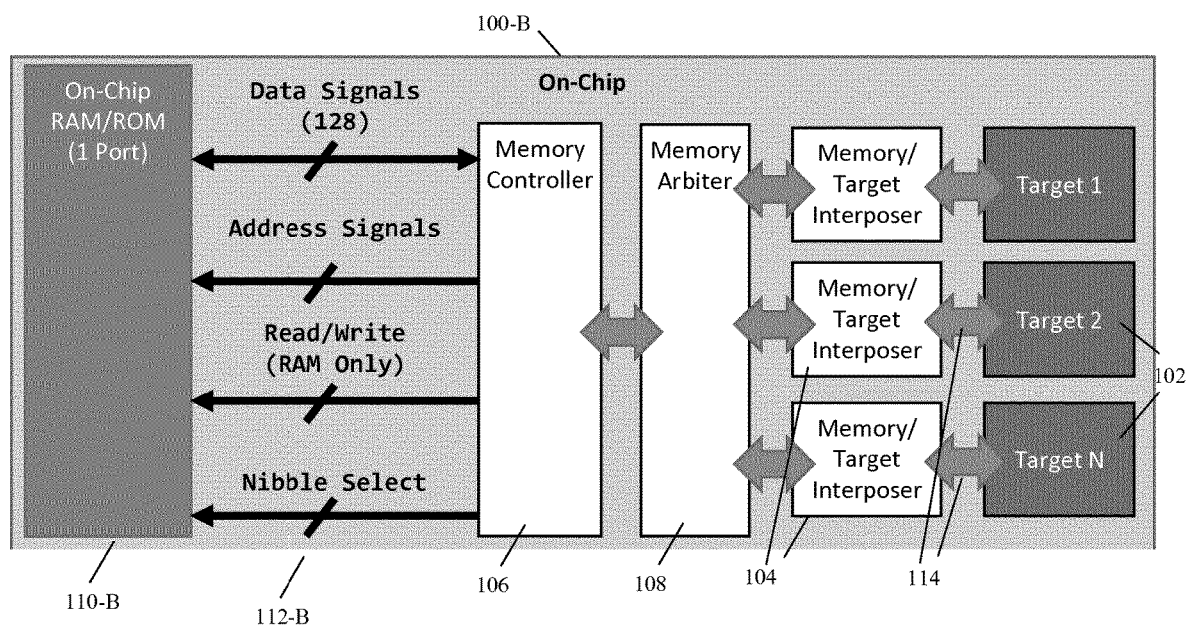

FIGS. 1A and 1B illustrate two different possible approaches for performing operations on targets 102 in integrated circuits 100-A and 100-B, respectively (e.g. ASICs, SOCs, etc.). Targets 102 can comprise memories, mode of operation logic, clocking control logic (e.g. On Product Clock Generation (OPCG)), Built-In-Self-Test (BIST) logic, registers for controlling scheduling updates and other operations, etc. Typically, these components are on-chip, however off-chip targets are also possible. The data streams 114 that are used to program targets 102 are intended to cause the targets 102 to perform any desired operation such as mission mode operations, system level stimulus, or test related operations such as Power-On-Self-Test (POST), Memory Built-In-Self-Test (MBIST), and Logic Built-In-Self-Test (LBIST). These are collectively referred to herein as a "defined operation."

In both example approaches, memory/target interposers 104 are needed on-chip to provide data in data streams 114 to targets 102 and to collect results from them. This data is typically obtained by interposers 104 using an on-chip memory controller 106 as arbitrated by a memory arbiter 108. It should be noted that integrated circuits (ICs) 100-A and 100-B can include many other components not shown such as analog circuits, processor cores, other memories and logic circuits, etc. However, these are omitted here for sake of clarity of the invention.

In the example of FIG. 1A the data required for performing the desired operations on targets is stored off-chip in an external Read-Only Memory (ROM) or Random Access Memory (RAM) or other device and is read onto IC 100-A and applied to a specific target 102 on-chip when required. This method requires additional chip input and outputs (IO) for an interface 112-A to read this data. Alternatively, these IO can be shared for other purposes if possible. In addition to IO, there is significant on-chip area required to communicate with the ROM/RAM and structure the data correctly for loading the functional targets.

In the example of FIG. 1B, the data is stored in an on-chip memory 110-B (e.g. RAM/ROM) with internal interfaces 112-B, which eliminates the need for external interfaces 112-A as in the example of FIG. 1A. However, it should be apparent that for both of these cases, the data stream 114 required for programming the functional on-chip targets requires additional logic and consumes a significant amount of chip area, IOs and memories.

It should be further noted that data streams 114 can be transmitted serially (1-bit wide) or in parallel (multiple bits wide). Serial and parallel streams each have advantages and disadvantages. Parallel data streams allow for faster word type programming of the function but increase wiring congestion within the design. Serial data streams reduce wiring but increase the time for distributing the data. The choice for serial or parallel streams is often based on the needs of the target device being programmed by the data stream. And, as noted above, embedding these data streams 114 within a design using either a chip interface or on-chip memory as in FIGS. 1A and 1B significantly increases the area, power, and complexity of the entire system.

When considering possible solutions to the above-mentioned problems, the present applicants recognize several potentially competing concerns.

For analog and digital parts for many applications such as in the automotive industry, the significant logic increase or packaging change due to adding mission mode or other test operations into a design required by the above techniques can make these mission mode or other operations unfeasible or push the design out of a profitable price point in its market. Meanwhile, in safety critical markets, mission mode or test operations cannot be eliminated. These features must be implemented, otherwise required standards and specifications for safety and quality will not be met. These markets demand a more cost effective solution.

The present applicants further recognize that adding a large amount of logic to implement these features also increases the Defective Parts-Per-Million (DPPM) for production chips. As logic size increases so does the probability of manufacturing defects and early life failures. In the technique of FIG. 1B, for example, if the on-chip RAM/ROM is not operating properly, there is no alternative, the chip must be declared defective since it cannot provide the on-chip data streams upon request as required.

In view of these and other concerns, the present applicants recognize that to address the market effectively, the industry needs a solution that is compact, continually operating, and selective with the ability to move across different interfaces and deal with data streams of difference sizes and dimensions. Additionally, the solution needs the flexibility for chaining multiple operations or groups of operations together, and a mechanism to select which group of operations to perform when requested. The solution needs to be a true building block with flexibility across many applications. Finally, the solution must be able to minimize the probability of a defect in the solution to reduce DPPM as well as to support a fault tolerant design. The fault tolerance must be capable of identifying defects while in system and defect correction or tolerance in system when required for these safety-critical applications.

According to certain aspects, the present applicants recognize that the data streams to program a target are not random. These data streams typically need to occur in a specific order and have certain contents and often certain data streams or groups of data streams are repeated. This provides very specific data content and access order requirements for the data to be streamed. The present embodiments leverage these requirements to meet the data streaming needs with minimal complexity compared to other approaches.

Figure 2:
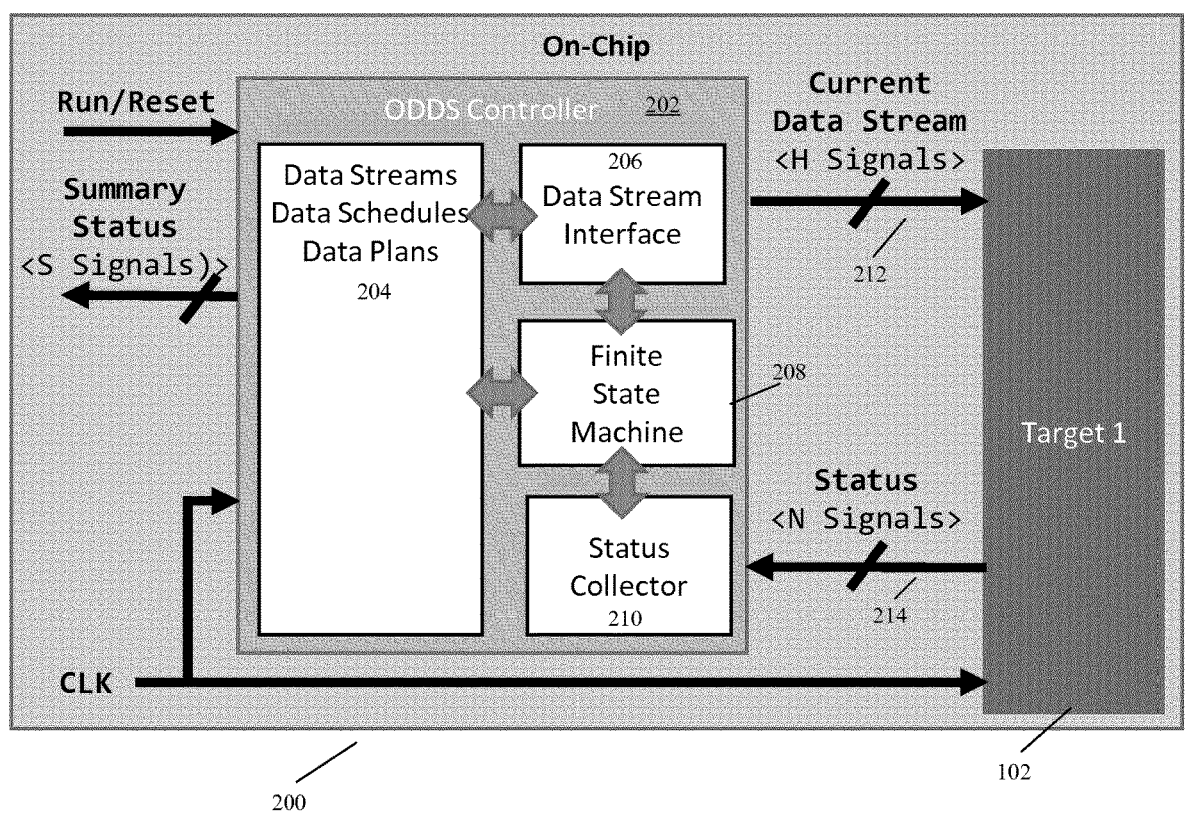
FIG. 2 is a block diagram of an example on demand data stream (ODDS) controller according to embodiments.

Embodiments include what is referred to herein as an On-Demand Data Stream (ODDS) controller. FIG. 2 shows an example block diagram of a single ODDS controller 202 implementation in an integrated circuit (e.g. ASIC or SOC) 200. As shown in FIG. 2, ODDS controller 202 includes a store 204 for data streams, data schedules and data plans (described in more detail below), a data stream interface 206, a finite state machine 208 and a status collector 210.

In general operation according to embodiments, in response to a Run/Reset signal, finite state machine 206 accesses the streams, schedules and plans in store 204, and based on the particular schedules and plans (as will be described in more detail below), causes data stream interface 206 to send data streams 212 to target 102. In response to data streams 212, target 102 can send back status signal(s) 214 to ODDS controller 202, which are received by status collector 210 under control of finite state machine 208, which can further format and output a summary status.

More particularly, in embodiments the Run/Reset input signal initiates the data stream output from the ODDS controller 202 and can also reset the ODDS controller 202. The Run/Reset signal can be sent by any on-chip or off-chip initiating entity (perhaps including another ODDS controller as described below), depending on the particular target and desired operation to be performed. For example, this signal can be driven by the chip 200's Power-On-Reset (POR) circuit to run data streams immediately at power on after reset. For performing mission mode operations or system level stimulus, this signal can be driven by an on-chip unit or external device such as another processor in the functional system. For test related operations such as POST, MBIST and LBIST, this signal can be driven by a microcontroller or other scheduling device which is coordinating the execution and scheduling of ODDS controller operations across the system.

The ODDS controller 202 CLK input signal is typically, but not required to be, the same clock as the target device 102 receiving the data stream. This allows all signals between the ODDS controller 202 and the receiving device 102 to be considered synchronous signals. When the ODDS controller 202 is used in mission-mode this common clock is typically free running but it can also be controlled by another on-chip unit or external device.

By configuration of the finite state machine 208, the ODDS controller 202 knows what the streams are and what data stream, data schedule, and/or data plan stored in store 204 are to be executed on-demand. To control these data streams, preferably some additional information is provided to the ODDS controller 202. For example, certain targets 102 may require time to process the data stream before moving to the next data stream. Others may indicate that they have received the data stream. This information is provided via the status inputs returned to the ODDS controller. One example of a Status input is a signal to trigger the ODDS controller to advance to the next data stream. Another example of a Status input is a pass/fail signal, in which case the ODDS controller could skip or select a specific data stream.

In embodiments such as that shown in FIG. 2, ODDS controller 202 has the ability to receive individual status from its target 102 and provide a Summary Status back to the entity initiating the ODDS controller 202. In other embodiments, the ODDS controller 202 and target 102 can be configured to allow the initiating entity to listen to the target 102 Status signals directly or both the target 102 Status signals and ODDS controller 202 Summary Status signals, for example to allow the initiating entity to know if a task is completed and/or of a test passed/failed.

According to certain aspects, ODDS controller 202 is designed for simplicity to work directly with the simplest targets 102 which may merely indicate an Acknowledgement when a full data stream has been received and is being processed. Additionally, other Status signals can indicate when the operation commanded by the data stream fails. The Status signals are configurable to allow these to be set by the target 102 for the simplest case.

It should be noted that, although FIG. 2 illustrates an example of a one-to-one correspondence between ODDS controller 202 and target. However this illustration is not meant to be limiting, and embodiments may include a one-to-many correspondence, a many-to-one correspondence and a many-to-many correspondence between ODDS controller(s) 202 and target(s).

Figure 3:
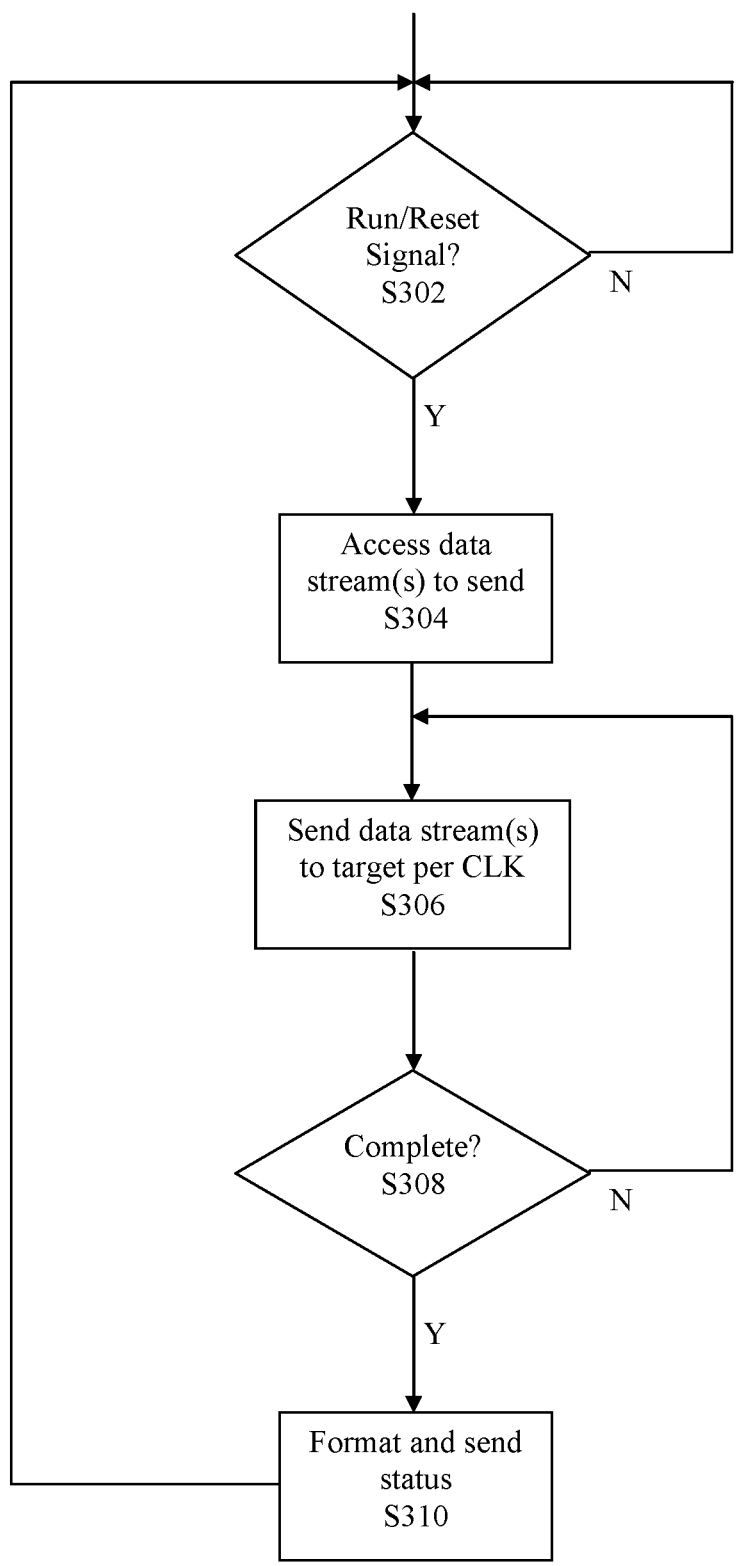
FIG. 3 is a flowchart illustrating an example operation of an ODDS controller according to embodiments.

FIG. 3 is a flowchart illustrating an example operation of ODDS controller 202 according to embodiments.

As shown, ODDS controller 202 waits until a Run/Reset signal is received from an initiating entity, including any on-chip or off-chip entity as described above. When such a signal is received as determined in step S302, processing proceeds to step S304 where the ODDS controller 202 accesses data stream(s) in store 204 to prepare to send to the target.

Processing proceeds to step S306 where the ODDS controller 202 begins to send the data stream(s) to the target. In one possible example, ODDS controller 202 merely sends all the data stream(s) in store 204 to the target from beginning to end without interruption or other processing. In other example embodiments, step S306 may also include collecting status signals back from the target, such as a status signal indicating whether the data stream(s) was successfully received. In these and other examples, depending on the status received from the target, ODDS controller 202 may interrupt or otherwise alter the streaming of data to the target, and may further send a corresponding status back to the initiating entity. As an additional or alternative example, step S306 may be performed in stages, perhaps in correspondence with status signals from the target. For example, step S306 may include sending one data stream or data stream portion from store 204 to the target, waiting for an acknowledgment or similar signal to be received back from the target, and then sending a next data stream or data stream portion in store 204 to the target.

As shown in the example of FIG. 3, the sending of data stream(s) to the target is performed in correspondence with a CLK signal, with either a serial bit or parallel set of bits being sent to the target on each CLK. However, this is not necessary in all embodiments. For example, some embodiments may implement a two-dimensional approach, wherein a set of bits in a data stream are sent to the target asynchronously. Another example is providing a means for sending data to multiple targets at the same time, in which each bit in the set of bits is sent in parallel to each separate target at the same time. This mechanism can also be used in ODDS manager applications as will be described below.

In step S308, the ODDS controller 202 determines whether all of the data stream(s) in store 204 have been sent to the target or if the processing of step S306 has otherwise completed. In one possible example, ODDS controller 202 is hard coded and merely determines in step S308 whether all of the data in store 204 from beginning to end has been sent. In other examples, ODDS controller 202 waits to receive a status signal from the target indicating that all of the data that was sent has been successfully received. In these and other examples, ODDS controller 202 can also wait to receive a status signal from the target indicating whether a particular task associated with the sent data stream(s) was performed successfully (e.g. a test pass/fail indication). In any event, processing advances to step S310, where the ODDS controller 202 formats a summary status based on the results and/or collected status signals and returns the summary status to the initiating entity and processing returns to step S302.

Those skilled in the art will understand various ways to implement an ODDS controller 202 with corresponding circuitry in an integrated circuit design after being taught by the present examples. Likewise, those skilled in the art of embedding mission mode and other test capabilities into an IC, such as is performed during an IC design flow using DFT and other techniques, will understand how to adapt such techniques to incorporate an ODDS controller according to the present embodiments.

It should be noted, however, that the ODDS controller 202 of the present embodiments consumes much less area and requires fewer primary inputs (PI's) and primary outputs (PO's) than other existing approaches such as using an on-chip ROM or RAM and a separate controller to issue the data streams to the target as shown in FIGS. 1A and 1B. In addition, because of the minimal footprint, advanced configurations such as redundancy can be implemented to enable high-reliability and safety-critical functions as will be described in more detail below.

Moreover, traditional approaches using ROM's require several complex logic blocks which are anchored in their position on the chip by the ROM itself. These logic blocks must be located near the ROM. This creates wiring congestion across the chip because a bus of signals must be routed to each target. In addition, the targets may not be all located in the same place in the chip so the buses must scatter throughout the chip to each target.

Because of the specific data order requirements for mission mode and other operations, the ODDS controller 202 is able to use local VDD and ground signals near the targets during operation to store the data streams. This allows the actual data streams to be stored in a distributed fashion throughout the chip and located near the targets. This greatly reduces wiring congestion on chip. In addition, the communication to the targets may be a single data stream wire to the target and a single status wire from the target. This wiring requirement is much less costly than the bus of signals required to communicate with a ROM. This again greatly reduces wiring congestion on chip.

As set forth above, ODDS controller 202 provides a data stream 212 stored in store 204 to program any device or function on or off-chip with minimal area impact to the design. It is small, quick, and flexible for multiple applications. In embodiments, within each individual data stream 212 is the program load for one operation for one target device type.

Figure 4A:
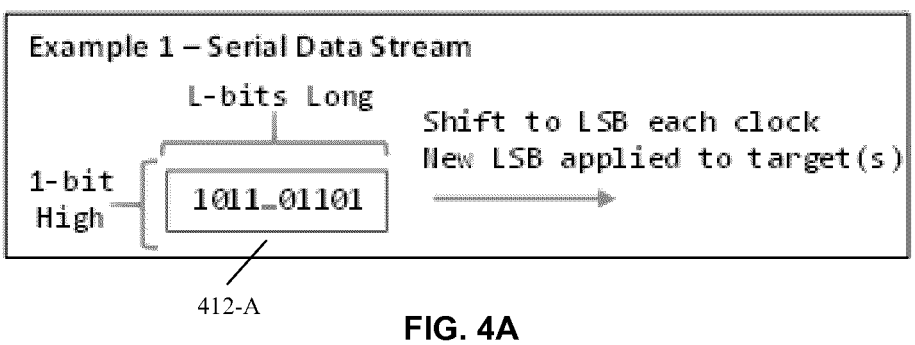
FIGS. 4A and 4B are diagrams illustrating examples of data streams that can be used to program targets according to embodiments.
Figure 4B:
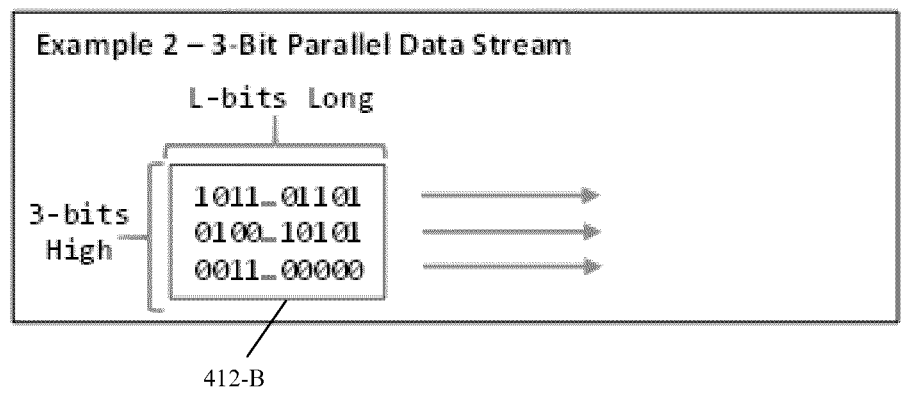

FIGS. 4A and 4B show two of many possible examples of data stream 212 that can be stored in store 204 and used to program target 102 according to embodiments. In both examples, the streams are L-bits long (it should be noted that different streams stored in store 204 can have different bit lengths). In the example of FIG. 4A, the stream 412-A is a serial bit stream (i.e. 1-bit high). On each clock cycle, one bit of the stream is applied to the target 102. In the example of FIG. 4B, the stream 412-B is a parallel bit stream of 3 rows of L-bits. On each clock cycle, one bit from each of the three rows in stream 412-B is applied to the target 102 in parallel.

According to certain aspects, in some embodiments, individual data streams can be grouped to form a data stream schedule to perform program loads for multiple operations. In addition, data stream schedules can be grouped into data stream plans to allow on-demand execution of multiple data stream schedules, reordering of data stream schedules, and reuse of data stream schedules across multiple plans.

Figure 5:
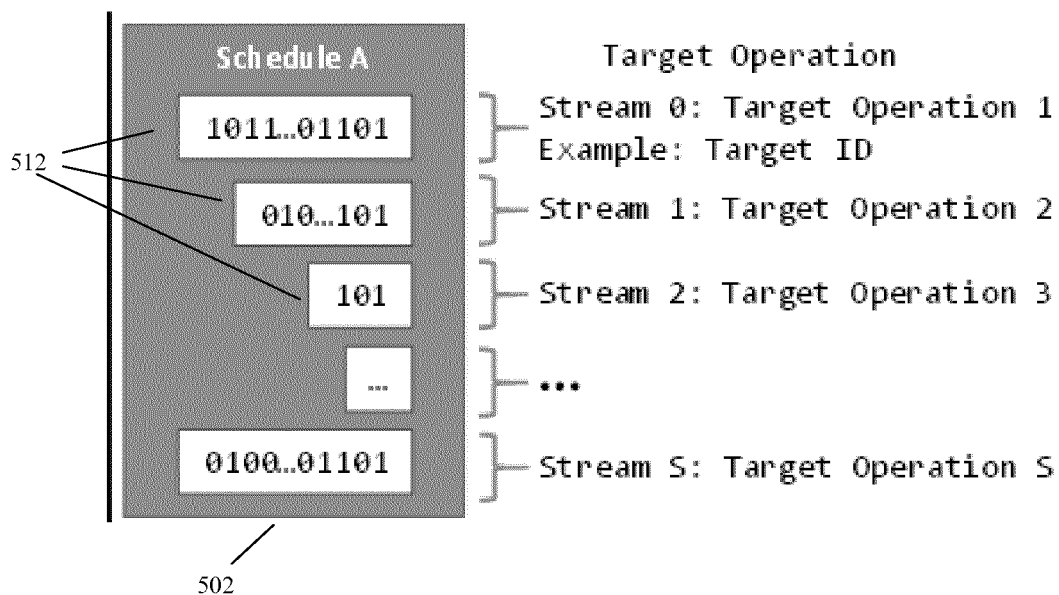
FIG. 5 is a diagram illustrating an example of how one or multiple data streams can be grouped together into a data stream schedule according to embodiments.

FIG. 5 shows an example of how one or multiple data streams 512 can be grouped together into a data stream schedule 502 according to embodiments. The streams 512 in schedule 502 can be applied to the same target 102 by the same ODDS controller or can be applied to different targets by the same or several ODDS controllers that are linked together by a manager or other entity, as will become more apparent from the descriptions below. According to aspects, however, each stream 512 is a complete stream needed to complete a specified target programming or to identify a target for a subsequent target programming as will be described in more detail below.

Figure 6:
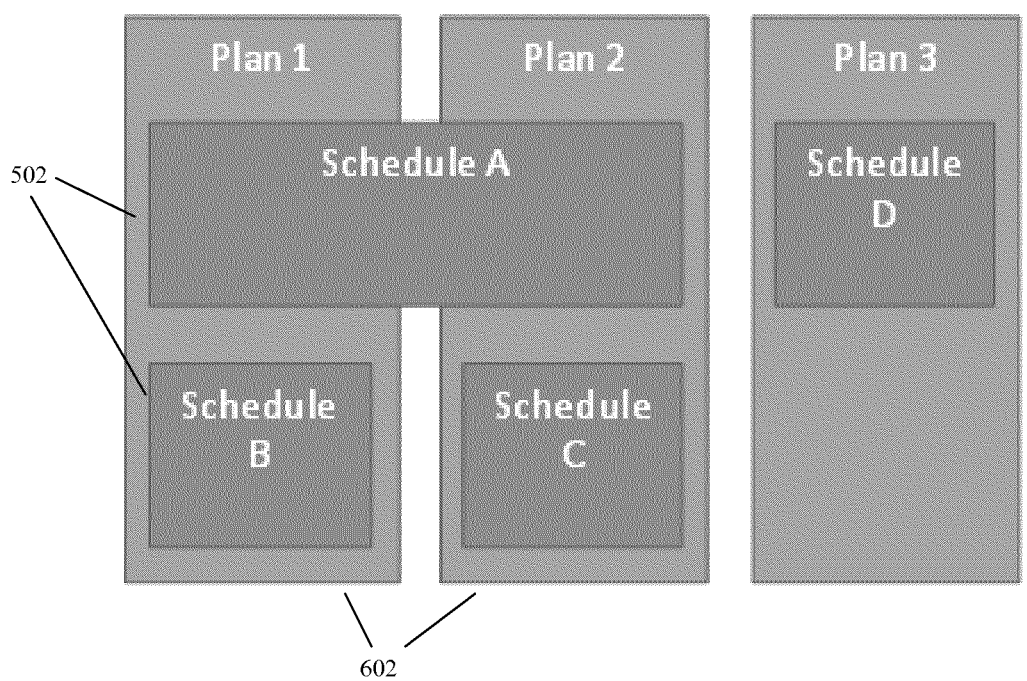
FIG. 6 is a diagram illustrating an example of how one or multiple data stream schedules can be grouped together into a data stream plan according to embodiments.

FIG. 6 shows an example of how one or multiple data stream schedules 502 can be grouped together into a data stream plan 602 according to embodiments. This also shows how data stream schedules 502 can be reused across multiple data stream plans 602.

In embodiments, a single ODDS controller such as that described above in connection with FIG. 2 can store and support multiple data streams, data stream schedules, and/or data stream plans such as those described above. In embodiments, each of these can be selected to allow a single ODDS controller 202 to execute a specific portion of program loads specified by these streams, schedules and/or plans stored in 204 to one or more targets on request (e.g. specified by the run/reset signal). In alternative embodiments, all of the program loads specified by these streams, schedules and/or plans stored in a single store 204 can be sent to one or more targets with control of the order of execution specified by the finite state machine 208.

Figure 7:
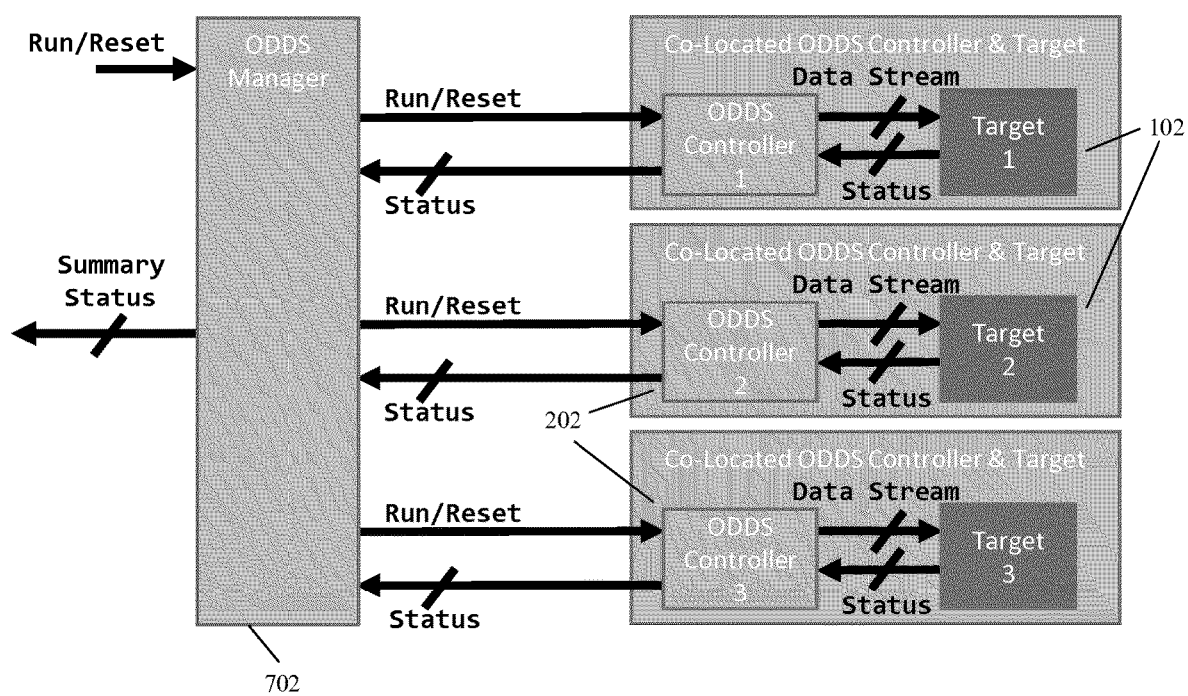
FIG. 7 is a block diagram illustrating an example of ODDS manager in accordance with these embodiments.

In further alternative embodiments, with multiple test plans in place, another component referred to herein as an ODDS manager is used to select which plan or plans are run upon request or in accordance with a designed task. FIG. 7 shows an example of ODDS manager 702 in accordance with these embodiments. In example embodiments, ODDS manager 702 has logic to respond to specific requests (e.g. specified by the run/reset signal) for causing individual data streams and/or data stream schedules that are predetermined and stored in stores of ODDS controllers 202 to be sent to corresponding targets. ODDS manager 702 can also be configured according to data stream plans and can selectively (e.g. in response to a request specified by the run/reset signal) cause the predetermined plans to be executed by ODDS controllers 202, which are pre-configured and have corresponding schedules and streams stored in stores of ODDS controllers 202. Those skilled in the art will understand how to implement such logic in ODDS manager 702 after being taught by the present examples, such as by adapting an ODDS controller 202 shown in FIG. 2. The ODDS manager 702 can also be extended to perform additional functions as will be described in more detail below.

According to certain aspects, ODDS manager 702 according to embodiments further supports a distributed architecture by allowing the data streams and ODDS controllers 202 to be localized to the targets 102, which minimizes the wiring across the design. In these and other embodiments, the ODDS manager 702 can be placed in a centralized location with respect to ODS controllers 202 to allow even communication to each of the ODDS controllers 202. Additionally, the communications required between the ODDS manager 702 and each ODDS controller 202 only comprise a Run/Reset signal to select and initiate the ODDS controller 202 and optionally one or more signals to report the status from the ODDS controller 202.

With the ODDS controllers 202 co-located with the targets 102 as shown in FIG. 7, the short wire lengths allow for both to operate at a high functional frequency clock. For example, the ODDS controllers 202 and their targets 102 can operate at a high functional frequency which significantly reduces the run-time for the operation being performed, such as 500 MHz or 1 GHz. If the ODDS controller 202 is used to test the target 102 at functional frequency, the quality of the test is improved by detecting small transition defects found at the functional frequency but not at a slower frequency.

Meanwhile, in embodiments, the signals from the ODDS manager 702 to the ODDS controllers are asynchronous signals. This means that the ODDS manager 702 can operate at a slower frequency, such as 10 MHz, to communicate status on-chip or off-chip. This further means that ODDS controllers can be assigned to clock domains.

In embodiments such as that shown in FIG. 7, the ODDS manager 702 can act as an external controller coordinating communication between the ODDS controller 202 and its target device(s) 102. This allows for the Status signals to be provided by the target 102, the ODDS manager 702, or a combination of both to coordinate the data streams sent by the ODDS controller 202. Further examples in connection with these and other aspects will be described in more detail below. It should be noted, however, that ODDS manager 702 can reside on or off-chip, though preferably it is on-chip to minimize the IO impact required for off-chip communication.

According to certain aspects, the present applicants recognize that data streams to setup and run on-chip functions are commonly used in safety critical applications where a device must test itself during a mission mode operation to ensure it is operating correctly. For such, systems the first test is typically a POST that occurs as soon as the chip is powered on and reset is applied and removed. In such a scenario, the POST contains a schedule of multiple items to test. The POST can be run directly by an ODDS controller according to embodiments or for complex systems it may be desired to further have a POST controller to manage the complex operations. In this scenario it is critical the POST controller and ODDS controller are functional to verify the chip and avoid throwing away a design when the POST manager is defective.

The present applicants further recognize that ROM based solutions are very high in area and complexity and proportionally more prone to silicon defects. In addition, their large area makes them unsuitable for redundancy applications. Additionally, with a ROM there is a single point of failure. If the complex ROM or any of its associated logic has a defect then the data streaming solution does not work. This causes a reduced DPPM.

According to certain aspects, the ODDS controller's minimal area provides significant benefit to applications where the on-chip POST or other controller must be functional and minimize throwing away chips just because the controller is not working. In this case, the minimal area of the ODDS controller allows it to be cloned and used for redundancy. This redundancy allows configurations for error detection and correction as described in more detail below, which further increases chip reliability and allow for continued operation of the chip even when an ODDS controller fails.

For example, as described in more detail in connection with FIGS. 8 and 9, some optional embodiments using ODDS controllers 202 can be used to detect and signal when the ODDS controller's data stream cannot be trusted and to further continue to provide a data stream when one ODDS controller is failing, respectively.

Figure 8:
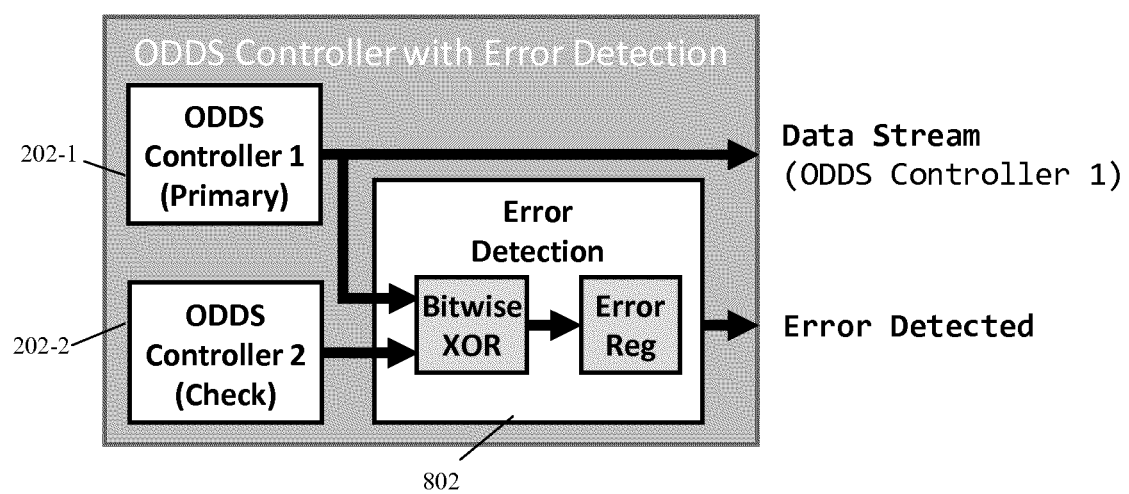
FIG. 8 is a block diagram illustrating an example configuration of ODDS controllers for performing single error detection in accordance with embodiments.

More particularly, FIG. 8 illustrates an example configuration of ODDS controllers for performing single error detection in accordance with embodiments. As shown, this configuration includes parallel ODDS controllers 202-1 and 202-2. These controllers are both configured with the same data streams and coupled to simultaneously receive the same input signals (e.g. Run/Reset, Clock signals, not shown). As shown, the configuration further includes an error detection block 802. During operation, both ODDS controllers 202-1 and 202-2 simultaneously output data streams, but only the data stream from primary ODDS controller 202-1 is provided to the target 102. Meanwhile, the data streams from both ODDS controllers 202-1 and 202-2 are also received by error detection block 802, which performs a bitwise XOR on them, with the bitwise comparison result provided to an error register. If at any time the data streams do not match, the error register raises an error signal to target 102, which can then halt operations and report to the initiating entity that a failure has occurred so that it can take the appropriately programmed action.

Figure 9:
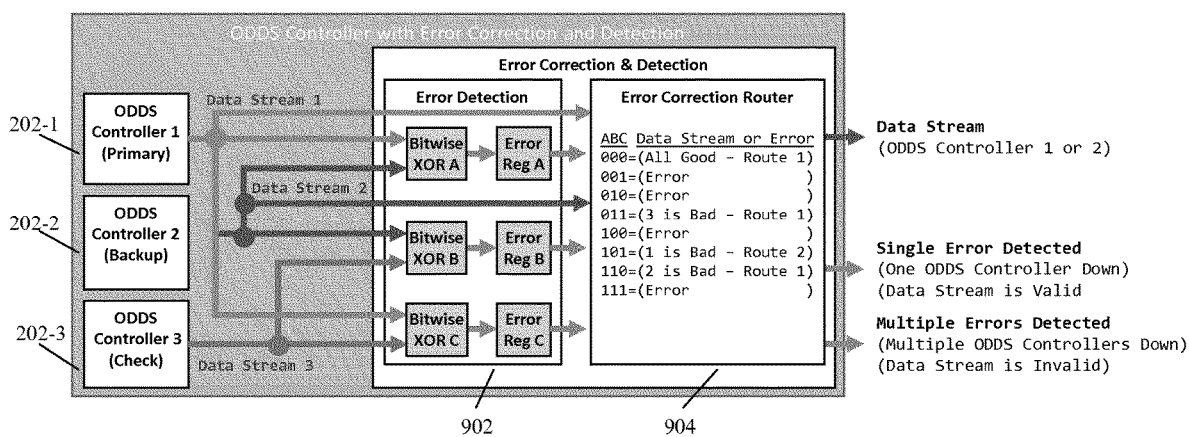
FIG. 9 is a block diagram illustrating an example configuration of ODDS controllers for performing detection and correction in accordance with embodiments.

FIG. 9 illustrates another example configuration of ODDS controllers for performing detection and correction in accordance with embodiments. As shown, this configuration includes parallel ODDS controllers 202-1, 202-2 and 202-3. These are all configured with the same data streams and coupled to simultaneously receive the same input signals (e.g. Run/Reset, Clock signals, not shown). As shown, the configuration further includes an error correction and detection block 902 and error correction router 904. During operation, all of ODDS controllers 202-1, 202-2 and 202-3 simultaneously output data streams. The data streams from primary ODDS controller 202-1 and backup ODDS controller 202-2 are provided directly to error correction router 904. Concurrently, the data streams from all of ODDS controllers 202-1, 202-2 and 202-3 are also received by error detection block 802. Block 802 simultaneously performs three bitwise XOR operations on them, with each bitwise comparison result provided to a corresponding error register. One bitwise XOR A compares data streams from controllers 202-1 and 202-2. A second bitwise XOR B compares data streams from controllers 202-2 and 202-3. A third bitwise XOR C compares data streams from controllers 202-1 and 202-3. Based on the results of the comparison, as shown in FIG. 9, error correction router 904 forwards the good data stream from either of controllers 202-1 or 202-2, and can concurrently raise an indication of operating in a reduced mode to the initiating entity (i.e. one of the redundant systems is compromised, but can still run successfully). In this case of multiple errors from both controllers 202-1 and 202-2, an error is issued to the initiating entity to signal that multiple redundancy engines have failed, which informs the initiating entity that the system can no longer continue to operate successfully.

According to additional aspects, in embodiments the ODDS controller 202 can be used whenever a stream of data is required to perform a task. This data stream can represent commands to a target device (such as the programming load described above), and further control inputs to a device, or be used for any other purpose. In accordance with these and other aspects, described in more detail below are possible applications where the ODDS controller 202 can be leveraged.

Figure 10:
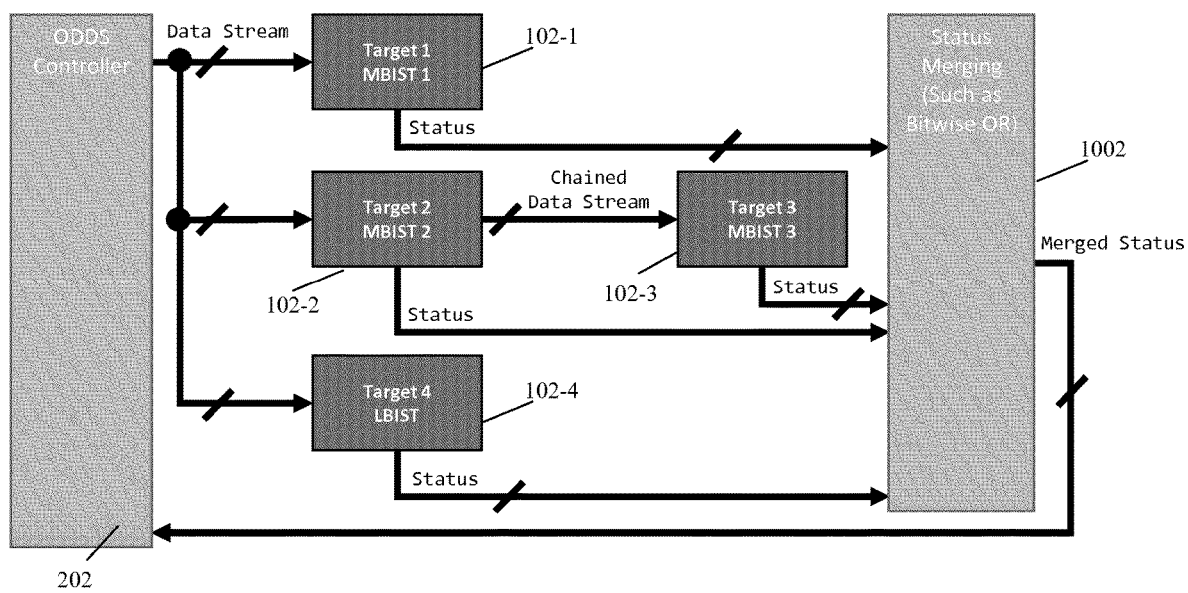
FIG. 10 is a block diagram illustrating an example configuration of an ODDS controller for streaming data to several targets according to embodiments.

In one example application illustrated in FIG. 10, there is one ODDS controller 202 streaming the same data to several targets 102-1, 102-2 and 102-4 at the same time. In some embodiments, all of the data streams from controller 202 cause targets 102-1, 102-2 and 102-4 to perform the operations commanded by the data streams. In other embodiments, certain of the data from controller 202 can instead include a Target ID to indicate to the target that subsequent data is intended for that target, otherwise the target can just ignore the data until its own Target ID is included in the data sent from controller 202.

As shown in the example of FIG. 10, target 102-2 can be configured to both read the data from ODDS controller 202 and forward the data from ODDS controller 202 to target 102-3 in a chain manner, for example. As further shown in the example of FIG. 10, the configuration can further include a status merging block 1002 to merge all the statuses from targets 102-1, 102-2, 102-3 and 102-4 (e.g. by performing a bitwise OR on the statuses) and provide a merged status back to controller 202.

Figure 11:
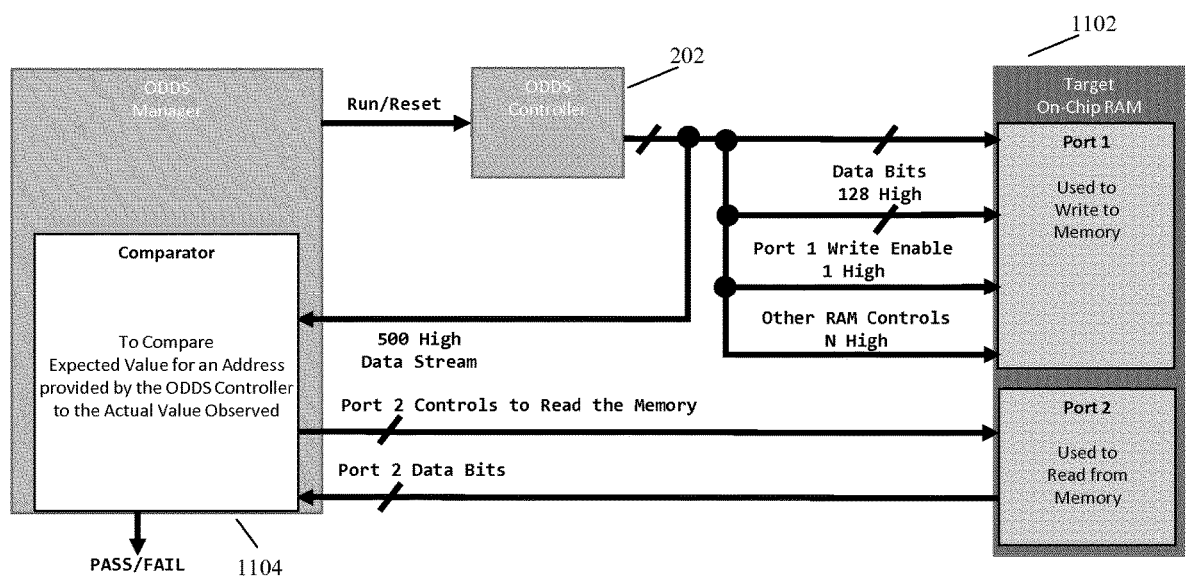
FIG. 11 is a block diagram illustrating an example configuration of an ODDS controller for implementing advanced functionality according to embodiments.

In other example applications, the ODDS controller 202 can be used to implement more advanced functionally. For example, as shown in FIG. 11, the ODDS controller 202 drives all the inputs (e.g. all 128 data bit inputs, a write enable input, and other RAM control signal inputs as shown in this example) in parallel to a memory 1102 to provide cycle by cycle control of memory 1102. ODDS manager 1104 is configured to cause the ODDS controller 202 to send its stored data streams to memory 1102, which cause specific addresses in the memory 1102 to be written, and simultaneously receive a copy of the data that is written to those addresses memory 1102. The ODDS manager 1104 can then read from specific addresses in the memory 1102 under its own control. The results of the reads/writes to memory 1102 can be compared in the ODDS manager 1104 to ensure what was written could be read. This functionality can be looped upon to form a primitive Memory Build-In-Self-Test (MBIST) engine to verify the functionality of the memory.

Figure 12:
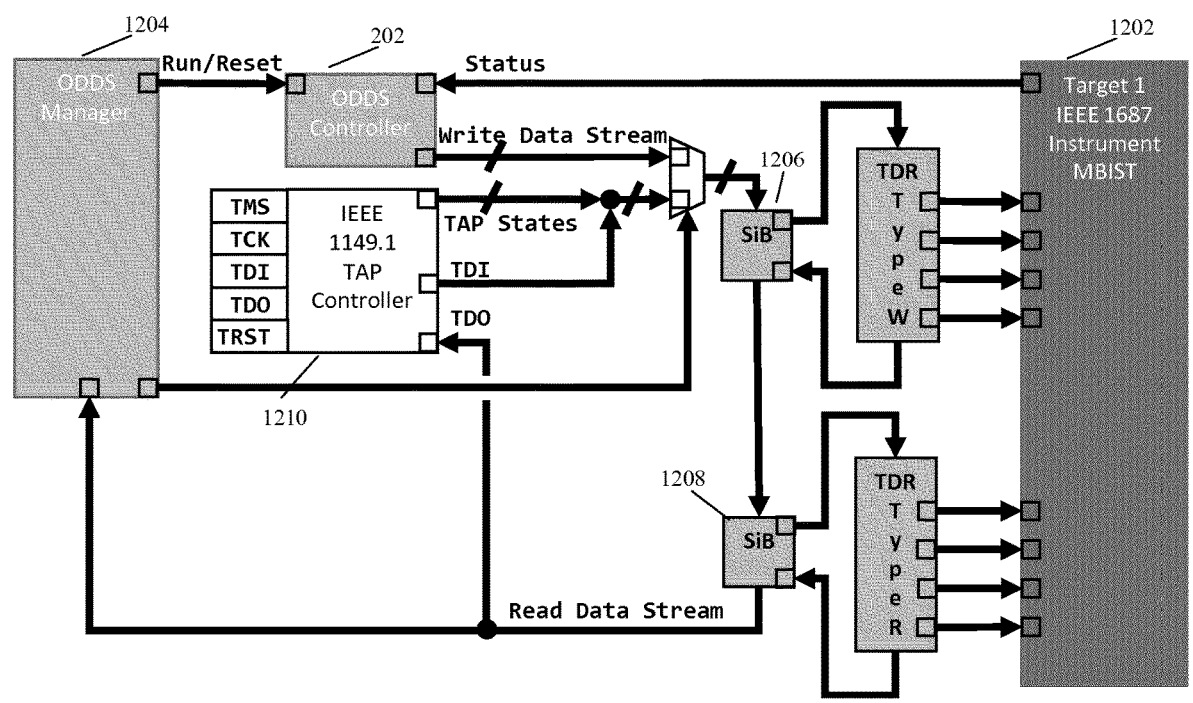
FIG. 12 is a block diagram illustrating an example of how a data plan can be used to control program loads to an IEEE1687 Instrument according to embodiments.

In another possible example application, the ODDS controller 202 can be integrated into IEEE 1687 and IEEE 1149.1 control systems. The ODDS controller 202 can also be used to control standardized interfaces such as IEEE 1687. For example, as shown in FIG. 12, a data plan can be created to control SiB's 1206 and 1208, and then to perform a series of program loads to an IEEE1687 Instrument 1202. More particularly, as shown in the example of FIG. 12, the data plan from ODDS manager 1204 can cause ODDS controller 202 to program and execute an IEEE 1687 compliant MBIST engine in cooperation with an IEEE 1149.1 TAP controller 1210. The ODDS manager 1204 observes the outputs to determine the results of the MBIST and the next action (i.e. data plan) to execute. Based on the results, subsequent data streams/schedules/plans controlled by ODDS manager 1204 could be for repair to issue commands to a repair engine to repair errors found by the MBIST test.

The present applicants recognize that the benefits of the ODDS controller of the present embodiments over existing solutions are plentiful when on-chip data streams must be stored and delivered to targets that are on or off-chip. First, the ODDS controller utilizes significantly less area, wiring, and complexity, making it very portable and usable in small designs, while also having high reliability and minimizing the risk the mission critical data stream controller itself has an issue causing the entire chip to be discarded.

An off-chip ROM solution with a 16×256 address would require 59 additional I/O pads whereas an on-chip ODDS controller according to the embodiments would not require any. But even with an on-chip ROM solution, for a 45 nm library with a 16×256 address (which is currently the smallest size available), the ROM solution would require logic consuming an area of 3357.11 square um. TABLE 1 below shows the dramatically smaller area required by an ODDS controller according to the present embodiments with the same program load and various addresses. These area numbers are for a 45 nm library.

TABLE 1

| ODDS Controller with Random Data Streams | Area (square um) |
| --- | --- |
| 16 Bit by 16 Data Streams | 214.434 |
| 16 Bit by 32 Data Streams | 227.772 |
| 16 Bit by 64 Data Streams | 243.846 |
| 16 Bit by 128 Data Streams | 259.587 |
| 16 Bit by 256 Data Streams | 272.916 |

An additional consideration for area is that programming a target device may take less than 16×256 bits of data. However, a 16 bit×256 address ROM is commonly the smallest ROM in libraries like the 45 nm library referenced above. This means the additional area of the ROM is either wasted unused area, or other data must be stored in the ROM, which increases wiring congestion to wire the data to different targets distributed throughout the chip. This gain is an advantage for the ODDS controller according to embodiments to be distributed throughout the chip and tailored to the size needs of its localized target.

Second, for safety critical applications, the minimal size of the ODDS controller also minimizes the probability of defects within the controller itself, thereby improving the number of chip Defective Parts-Per-Million (DPPM). In addition, the minimal area and building block approach to the ODDS controller can be leveraged for fault tolerant architectures with support for error detection and error correction with redundancy for high reliability applications. This is critical for use in safety critical applications. Separate mechanisms for single error detection and single error correction with multiple error detection were described above, but such mechanisms are not limited to these. Since the data stream controller is often a Mission Critical function, if the data stream controller is defective the chip is defective. The ODDS controller provides mechanisms to prevent issues in the event of a single error to allow high reliability and safety critical use.

Third, the ability to co-locate the ODDS controller with its targets allows the storage and wiring to be distributed around the chip with minimal wiring versus traditional ROM approaches with many complex blocks and wiring busses to each target across the chip. This greatly reduces wiring and area congestion. In addition these short run lengths allow the ODDS controller to operate at the functional frequency of the target. This allows for full functional frequency operation rather than operation that must be run at a slower frequency. Running at the functional frequency greatly reduces run time for the operations and also provides the ability to test the targets at functional frequency for a higher quality of test.

Fourth, the ODDS controller is continually on-going, requiring no external stimulus to control the data streams other than the Run signal from whatever mechanism is commanding the data streams to be issued. This allows for the ODDS controller to be used for POST and Power-on-Reset (POR) tasks to initialize, setup, or test the chip or external chip devices before staring mission mode operation. In addition, the ODDS controller is on-demand so it can be run multiple times and at any time during Mission Mode or other operations to accomplish the tasks programmed into its data streams.

Fifth, the ODDS controller is selective with the ability to issue data streams across different interfaces to different targets. The data streams can have different sizes and dimensions (1 to M data streams deep, and 1 to N bits wide). The solution is flexible and allows chaining of multiple data stream operations into a data stream schedule and chaining multiple data stream schedules. The data stream schedules can be one data stream to many data streams. All data stream schedules can be run in a large group, or any combination down to a single data stream can be selected for running. This building block allows the ODDS controller to fit a variety of applications and architectures.

One potential limitation of the ODDS controller is not being able to reprogram the data streams after the chip is manufactured. The ODDS controller is made up of power and ground connections and the logic functions to properly create the data streams. These items are defined up front during synthesis and are unchangeable once the chip has been manufactured. Conversely, a ROM based solution can provide a mechanism to change the ROM contents after the chip is manufactured, with significant area overhead.

However, since the ODDS controller consumes significantly less area, it is possible to create multiple data streams, data schedules, and data stream plans up front during design and synthesis to allow flexibility in selecting between these plans once the design is manufactured. This allows for the definition of a target data stream plan up front as well as other plans, to provide multiple options for data streams after manufacturing. This mitigates any potential issue with not being able to reprogram the data streams after manufacturing. This replication consumes additional area but still allows the ODDS controller to be more area efficient than a ROM or other memory based solution. An example of this is described above.

Also, these limitations can be resolved by having the means to control the Run/Reset signal to each ODDS controller directly from a Test Data Register for programming in system or in the optional ODDS manager.

Although the present embodiments have been particularly described with reference to preferred ones thereof, it should be readily apparent to those of ordinary skill in the art that changes and modifications in the form and details may be made without departing from the spirit and scope of the present disclosure. It is intended that the appended claims encompass such changes and modifications.

What is claimed is:

1. An apparatus comprising:
a target of a defined operation, wherein the target is a hardware component of an integrated circuit;
a controller, wherein the controller is also a hardware component and is located within the integrated circuit together with the target, the controller including:
a store containing a complete set of data for enabling the target to perform the defined operation, and
a finite state machine that is configured to cause the complete set of data to be sent to the target from the store in a response to a signal for commencing the defined operation;
a second controller, also located within a same integrated circuit with the target, the second controller including a second store containing the same complete set of data as contained in the store of the controller; and
an error detector for receiving the data from both the controller and the second controller and for detecting an error in the data.

2. The apparatus according to claim 1, wherein the controller further includes a status collector for receiving a status signal from the target.

3. The apparatus according to claim 2, wherein the controller is configured to format and send a summary status to an initiating entity based on the status signal.

4. The apparatus according to claim 2, wherein the controller is configured to interrupt the sending of the data to the target in response to the status signal.

5. The apparatus according to claim 2, wherein the controller is configured to sequence sending portions of the data in response to the status signal.

6. The apparatus according to claim 1, wherein the sending of the data to the target is performed in synchronization with a common clock signal that is received by both the controller and the target.

7. The apparatus according to claim 6, wherein the common clock signal is a high functional frequency clock for the target.

8. The apparatus according to claim 1, wherein the controller uses power and ground signals that are local to the target in the integrated circuit.

9. The apparatus according to claim 1, wherein the error detector is configured to generate an error signal to an initiating entity in response to a detected error.

10. The apparatus according to claim 1, further comprising:
a third controller, also located within the same integrated circuit with the target, the third controller including a third store containing the same complete set of data as contained in the store of the controller; and
an error corrector for receiving the data from all of the controller, the second controller and the third controller and for causing the data from one of the controller and the second controller to be sent to the target in response to a detected error in the data from the other one of the controller and the second controller.

11. The apparatus according to claim 1, further comprising:
a manager for generating the signal to commence the defined operation.

12. The apparatus according to claim 11, wherein the target comprises a memory, and wherein the mission mode operation comprises writing data to addresses in the memory, and wherein the manager is configured for both receiving the data sent from the controller to the memory and to read data from the addresses in the memory, the manager including a comparator for comparing the data written to the addresses in the memory and data read from the addresses in the memory.

13. The apparatus according to claim 1, wherein the target comprises a memory and the defined operation comprises a built-in self test (BIST).

14. The apparatus according to claim 1, wherein the target comprises a logic block and the defined operation comprises a power on self test (POST).

15. An apparatus comprising:
a first target of a first defined operation;
a second target of a second defined operation, wherein the first and second targets are hardware components of an integrated circuit; and
a controller, wherein the controller is also a hardware component and is located within the integrated circuit together with the first and second targets, the controller including:
a store containing a complete set of data for enabling the first and second targets to perform the first and second defined operations, and
a finite state machine that is configured to cause the complete set of data to be sent from the store to the first and second targets in a response to a signal for commencing the first and second defined operations, wherein the data includes a target ID that allows the first and second target to identify a portion of the data associated with the first and second defined operations, respectively.

16. A method comprising:

identifying a defined operation for a target in an integrated circuit, wherein the target is a hardware component of the integrated circuit;

identifying a complete set of data for enabling the target to perform the defined operation;

locating a controller as a hardware component in the integrated circuit together with the target;

configuring the controller to include a store containing the complete set of data and a finite state machine for causing the complete set of data to be sent from the store to the target in a response to a signal for commencing the defined operation, locating a second controller within the same integrated circuit with the target and the controller;

configuring the second controller to include a second store containing the same complete set of data as contained in the store of the controller; and configuring an error detector to receive the data from both the controller and the second controller and to detect an error in the data.

17. The method according to claim 16, wherein the complete set of data includes a first stream of data, the method further comprising combining the first stream of data with a second stream of data into a schedule.

18. The method according to claim 16, wherein the complete set of data includes a first stream of data, the method further comprising combining the first stream of data with a second stream of data into a first schedule, and combining the first stream of data with a third stream of data into a second schedule.

19. The method according to claim 18, further comprising combining one or both of the first and second schedule into a first plan and combining a different one or both of the first and second schedule into a second plan.

* * * * *